(12) United States Patent
Takada

(10) Patent No.: US 6,949,775 B1
(45) Date of Patent: Sep. 27, 2005

(54) SEMICONDUCTOR DEVICE HAVING A GUARD RING

(75) Inventor: Kazuhiko Takada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/528,296

(22) Filed: Mar. 17, 2000

(30) Foreign Application Priority Data

Mar. 19, 1999 (JP) .................................. 11-076730

(51) Int. Cl.⁷ .......................... H01L 29/74; H01L 23/48
(52) U.S. Cl. ...................... 257/127; 257/170; 257/409; 257/484; 257/758
(58) Field of Search ................... 257/127, 484, 257/620, 508, 758, 170, 339, 372, 374, 396, 257/397, 400, 409, 452, 490, 494, 495, 605, 257/507, 774

(56) References Cited

U.S. PATENT DOCUMENTS

| | | | | |
|---|---|---|---|---|
| 5,817,572 A | * | 10/1998 | Chiang et al. | 438/624 |
| 5,834,829 A | * | 11/1998 | Dinkel et al. | 257/620 |
| 6,022,791 A | * | 2/2000 | Cook et al. | 438/458 |
| 6,163,065 A | * | 12/2000 | Seshan et al. | 257/620 |

FOREIGN PATENT DOCUMENTS

| | | | | |
|---|---|---|---|---|
| JP | 7-201855 | | 8/1995 | |
| JP | 10-335456 | * | 12/1998 | H01L 21/768 |

* cited by examiner

*Primary Examiner*—Ori Nadav
(74) *Attorney, Agent, or Firm*—Westerman, Hattori, Daniels and Adrian LLP

(57) ABSTRACT

A semiconductor device has a guard ring in a multilayer interconnection structure, wherein the guard ring includes a conductive wall extending zigzag in a plane parallel with a principal surface of a substrate.

5 Claims, 12 Drawing Sheets

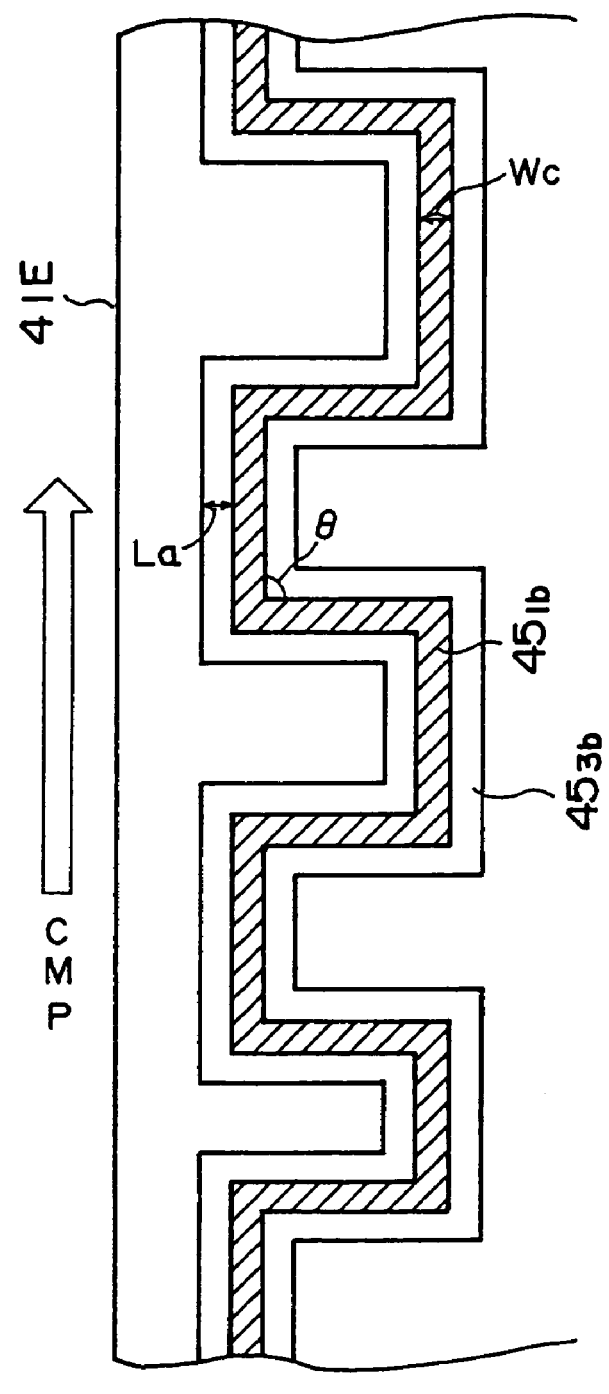

SEMICONDUCTOR DEVICE HAVING A GUARD RING

CROSS-REFERENCE TO RELATED APPLICATION

The present application is based on Japanese priority application No.11-76730 filed on Mar. 13, 1999, the entire contents of which are hereby incorporated by reference.

BACKGROUND OF THE INVENTION

The present invention generally relates to semiconductor devices and more particularly to a semiconductor device having a guard ring.

In the art of semiconductor devices, a so-called multilayer interconnection structure is used for interconnecting various semiconductor elements formed on a common substrate. A multilayer interconnection structure includes a number of interlayer insulation films provided on the common substrate for covering the semiconductor elements, wherein the interlayer insulation films carry an interconnection pattern in such a manner that the interconnection pattern are embedded in the interlayer insulation films.

In such semiconductor devices that use the multilayer interconnection structure, it is generally practiced to provide a guard ring structure along an outer periphery of the semiconductor substrate so as to block the penetration of moisture or corrosive gas into the interior of the semiconductor device along the interface between the interlayer insulation films.

FIG. 1A shows a typical conventional guard ring in an enlarged view, while FIG. 1B shows the overall construction of the guard ring of FIG. 1A in a plan view.

Referring to FIGS. 1A and 1B, it can be seen that a guard ring structure 12 is formed along an outer periphery of the semiconductor chip on which a semiconductor device 11 is formed, in such a manner that the guard ring structure 12 surrounds the semiconductor device 11 continuously.

FIG. 2 shows a cross-sectional view of the structure of FIG. 1B taken along a line 2-2'.

Referring to FIG. 2, the semiconductor device 11 is formed on a Si substrate 21 formed with a field oxide film 22, wherein the field oxide film 22 defines a diffusion region 21A on the surface of the Si substrate 21.

On the Si substrate 21, it should be noted that interlayer insulation films 23–25 are deposited consecutively so as to cover the field oxide film 22 and the diffusion region 21A, wherein the interlayer insulation films 22–25 may be formed of an inorganic material such as $SiO_2$, PSG, BPSG, and the like. Alternatively, the interlayer insulation films may be formed of an organic material such as fluorocarbon, hydrocarbon, polyimide, or organic SOG.

As represented in FIG. 2, the interlayer insulation film 23 is formed of a contact groove 23A exposing the diffusion region 21A, such that the contact groove 23A extends continuously along the outer periphery of the semiconductor device 11. The contact groove 23A is filled with a conductive wall 23B of W, and the like, and a conductive pattern 24A of W, WSi or polysilicon is formed on the interlayer insulation film 23 in mechanical as well as electrical contact with the conductive wall 23B. Thereby, the conductive pattern 24A extends along the outer peripheral edge of the semiconductor device 11.

The conductive pattern 24A thus formed, in turn, is covered by the interlayer insulation film 24, wherein the interlayer insulation film 24 is formed with a contact groove 24B so as to expose the conductive pattern 24A. Thereby, the contact groove 24B extends continuously and in parallel with the contact groove 24A along the outer periphery of the semiconductor device 11.

The contact groove 24B is filled with a conductive wall 24C of W, and the like, and a conductive pattern 25A of W, WSi or polysilicon is formed on the interlayer insulation film 24 in electrical as well as mechanical contact with the conductive wall 24C. Thereby, the conductive pattern 25A extends along the outer periphery of the semiconductor device in correspondence to the contact groove 24B.

The conductive pattern 25A, in turn, is covered by the interlayer insulation film 25 and a contact groove 25B is formed in the interlayer insulation film 25 continuously along the outer periphery of the semiconductor device 11 in a parallel relationship with respect to the conduct groove 24B, wherein the contact groove 25B is formed so as to expose the conductive pattern 25A.

Further, the contact groove 25B is filled with a conductive wall 25C and a conductive pattern 26A of W, WSi or polysilicon is formed on the interlayer insulation film 25 in electrical as well as mechanical contact with the conductive groove 25C, wherein the conductive pattern 26A is formed continuously along the outer periphery of the semiconductor device 11 in correspondence to the contact groove 25B. The conductive pattern 26A is covered by a protective film 26 such as SiN formed on the interlayer insulation film 25.

According to the construction of FIG. 2, the conductive walls 23B, 24C and 25C form, together with the conductive patterns 24A, 25A and 26A, the guard ring 12 represented in FIG. 1B. By forming such a guard ring 12, the problem of penetration of $H_2O$ or corrosive gas into the interior of the semiconductor device 11 along the interface boundary between the interlayer insulation films, such as the interface between the interlayer insulation film 23 and the interlayer insulation film 24, is effectively blocked.

Conventionally, the guard ring structure such as the one represented in FIG. 2 has been formed simultaneously to the formation of the multilayer interconnection structure. In such conventional multilayer interconnection structure, it has been practiced to form a conductive pattern on an underlying layer and cover the conductive pattern thus formed by an insulation film. The insulation film thus formed is further subjected to a planarization process.

In recent advanced semiconductor devices called submicron devices or sub-quarter-micron devices, on the other hand, delay of electric signals in the multilayer interconnection structure is becoming a serious problem. Thus, in order to address the foregoing problem of signal delay, it has been practiced to use low-resistance Cu for the conductive pattern in such a multilayer interconnection structure in combination with organic interlayer insulation films, which have a characteristically low dielectric constant.

In the multilayer interconnection structure using Cu for the interconnection pattern, it has been practiced to use a so-called dual-damascene process in view of the fact that patterning of Cu by a dry etching process is difficult, contrary to the conventional conductor material such as Al, W, Si or Au used for this purpose. In a dual-damascene process, interconnection grooves or contact holes are formed in the interlayer insulation film in advance and the interconnection grooves or contact holes are filled with a Cu layer by way of a suitable deposition process such as an electrolytic plating process. After the deposition of the Cu layer, the part of the Cu layer remaining on the interlayer insulation film is removed by a chemical mechanical polishing (CMP) process. As a result of the CMP process, a Cu pattern of Cu plug filling the interconnection groove or contact hole is obtained.

In view of the potential usefulness of forming extremely minute patterns, dual-damascene process is used not only in the multilayer interconnection structure that uses Cu for the interconnection patterns but also in general multilayer interconnection structure for use in advanced, highly miniaturized semiconductor devices. Further, CMP process can provide an exactly flat surface and is used extensively in various planarizing processes.

FIG. 3A shows a CMP process conducted to the semiconductor device 11 represented in FIGS. 1A and 1B, while FIG. 3B shows a part of FIG. 3A in an enlarged view.

Referring to FIGS. 3A and 3B, the CMP process is conducted on a rotating polishing platen covered with a polishing cloth, and a semiconductor wafer 10, on which a number of semiconductor devices are formed, is urged against the polishing cloth under a predetermined pressure while dropping a polishing slurry. As the same time, the semiconductor wafer 10 itself is also rotated at a predetermined speed.

When such a CMP process is applied to the semiconductor device 11 having the guard ring structure, it will be understood from FIG. 3B that there is a moment in which the direction of the CMP coincides with the elongating direction of the guard ring structure 12.

FIG. 4 shows the relative distribution of the velocity of slurry particles for the case in which the wafer 10 of FIG. 3A is urged against the polishing platen rotating at the rotational speed of 0.857 rps (rotation per second) while rotating the wafer 10 at the rotational speed of 0.857 rps.

Referring to FIG. 4, it will be noted that the velocity $v_x$ and the velocity $v_y$ of the polishing particles change, when the particles are on the central part of the wafer 10, along a circular path represented by a shading as a result of the rotation or revolution of the wafer 10. On the other hand, the velocities $v_x$ and $v_y$ of the slurry particles on the peripheral part of the wafer 10 change along a circular path represented in FIG. 4 by a continuous line. It should be noted that the x-direction and y-direction are defined for the two-dimensional Cartesian coordinate system fixed to the wafer 10.

As can be seen clearly from FIG. 4, the relative speed of the abrasive particles becomes larger in the peripheral part of the wafer 10 than in the central part due to the effect of increased distance from the rotational center of the rotating platen. This effect of increased relative speed of the abrasive particles at the peripheral part of the wafer 10 is enhanced when the diameter of the wafer 10 is increased.

Referring back to FIGS. 3A and 3B, it should be noted that the guard ring 12 on the wafer 10 experience a large stress at the time of the CMP process as a result of the engagement with the slurry particles, wherein the effect of the stress is enhanced in the semiconductor devices 11 that are formed on the peripheral part of the wafer 10 than in the semiconductor devices 11 formed on the central part.

In the state of FIG. 3B, it can be seen that the abrasive particles exert a stress in the elongating direction of the guard ring structure 12. In view of the fact that such a long continuous pattern generally includes, somewhere therein, a defective part where the adhesion to the underlying layer is poor, there is a substantial risk, in the state of FIG. 3B, that an exfoliation of the guard ring 12 may occur in such a defective part when the elongating direction of the guard ring 12 is coincident with the moving direction of the polishing particles. In the case the elongating direction of the guard ring 12 is oblique to the direction of the moving polishing particles, on the other hand, the guard ring 12 is laterally supported by the walls of the groove in which the guard ring 12 is formed, and no substantial exfoliation occurs even in the defective part. Further, such a problem of conductive pattern exfoliation associated with the CMP process does not occur in the interconnection patterns in the multilayer interconnection structure in view of the fact that such an interconnection pattern generally has a zigzag or complex pattern.

In the state of FIG. 3B, the guard ring 12 extending in the y-direction lacks such a lateral support structure, and thus, the existence of defective part in any of the conductive walls 23B, 24C or 25C easily causes damaging in the guard ring 12 in correspondence to such a defective part as represented in FIG. 5. In FIG. 5, it should be noted that those parts corresponding to the parts described previously ar5e designated by the same reference numerals and the description thereof will be omitted. In the structure of FIG. 5, it will be noted that the bottom surface and the side wall of the contact groove 23A is covered by an adhesion film $(23B)_1$ of a refractory metal compound such as TiN for improving the adhesion.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a guard ring structure wherein the problem of exfoliation of the guard ring structure during a CMP process is effectively eliminated.

Another object of the present invention is to provide a semiconductor device, comprising:
  a substrate; and
  a multilayer interconnection structure formed on said substrate,
    said multilayer interconnection structure including: an interlayer insulation film provided on said substrate; and a guard ring pattern embedded in said interlayer insulation film, said guard ring pattern extending along a periphery of said substrate in contact with a surface of said substrate,
  wherein said guard ring pattern has a zigzag pattern when viewed perpendicular to said substrate.

Another object of the present invention is to provide a method of fabricating a semiconductor device, comprising the steps of:
  depositing an interlayer insulation film on a substrate;
  forming a first groove in said interlayer insulation film to as to extend continuously along a periphery of said substrate;
  forming a second groove in said interlayer insulation film such that said second groove extend continuously in said first groove;
  depositing a conductive layer on said interlayer insulation film sot as to fill said first and second grooves; and
  removing a part of said conductive layer locating above said interlayer insulation film by a chemical mechanical polishing process, to form a guard ring pattern filling said first and second grooves,
  wherein said step of forming said second groove is conducted such that said second groove has a zigzag pattern in said first groove.

According to the present invention, the guard ring has a pattern that avoids extending continuously in a predetermined direction for a long distance. Thereby, the guard ring pattern is effectively supported by the interlayer insulation film at the side walls thereof in any two, mutually perpendicular directions.

Other objects and further features of the present invention will become apparent from the following detailed description when read in conjunction with the attached drawings.

BRIEF DESCRIPTION OF THE DRAWINGS

FIG. 11 is a diagram showing a guard ring structure according to a fourth embodiment of the present invention in a plan view.

DETAILED DESCRIPTION OF THE INVENTION

[First Embodiment]

Figure 6:
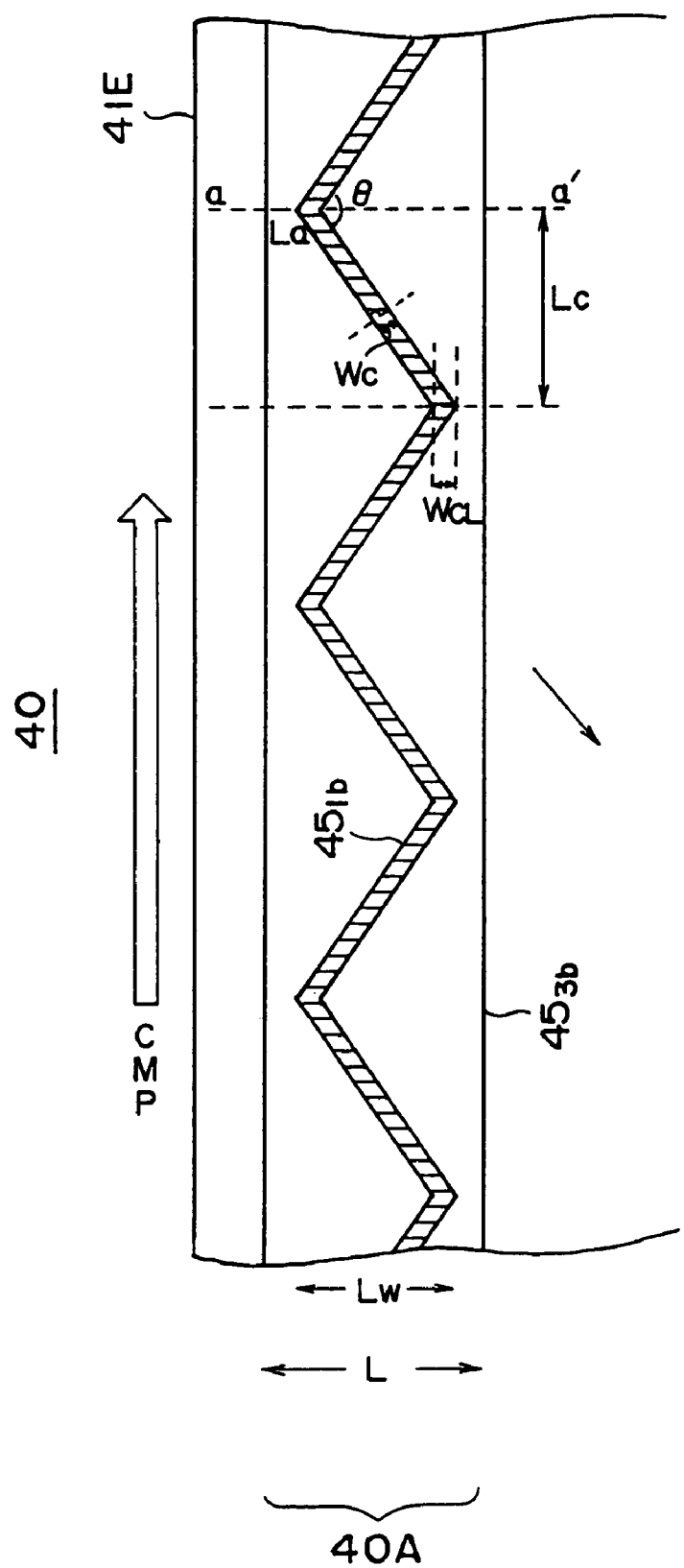
FIG. 6 is a diagram showing a guard ring structure according to a first embodiment of the present invention in a plan view.
Figure 7:
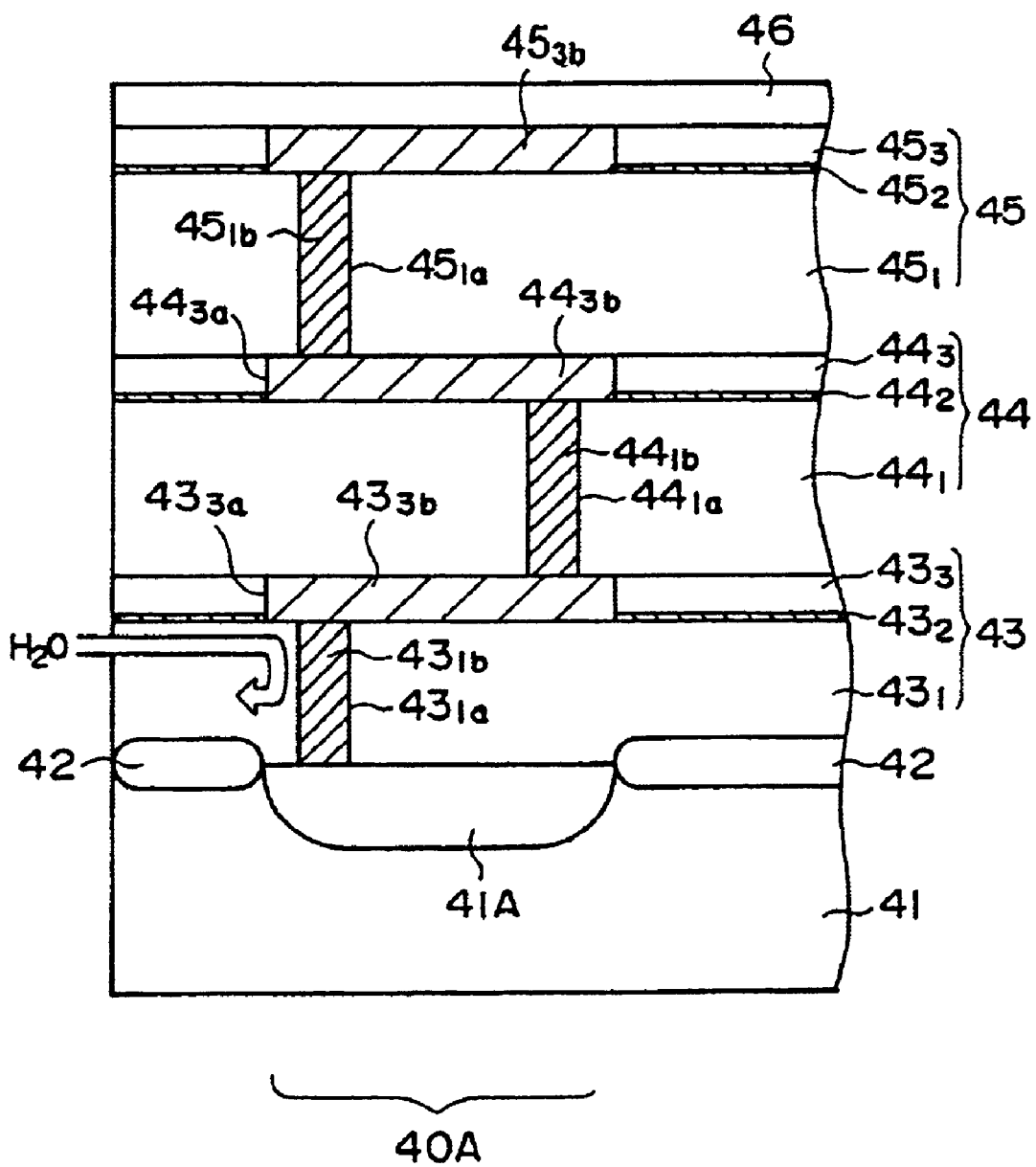
FIG. 7 is a diagram showing the guard ring structure of FIG. 6 in a cross-sectional view.

FIG. 6 shows the construction of a semiconductor device 40 according to a first embodiment of the present invention in a plan view, while FIG. 7 shows the semiconductor device 40 in a cross-sectional view.

Referring to the cross-sectional view of FIG. 7 first, the semiconductor device 40 is formed on a Si substrate 42 carrying thereon a field oxide film 42, wherein the field oxide film 42 defines a diffusion region 41A on the surface of the Si substrate 41.

The Si substrate 41 is covered with an interlayer insulation film $43_1$ formed of any of an inorganic insulation film such as $SiO_2$, PSG or BPSG, or an organic insulation film such as fluorocarbon, hydrocarbon, polyimide or organic SOG, wherein the interlayer insulation film $43_1$ is formed so as to cover the field oxide film 42 and the diffusion region 41A.

The interlayer insulation film $43_1$ is formed with a contact groove 431a exposing the diffusion region 41A, wherein the contact groove $43_1$ has a zigzag form and is formed continuously along the periphery of the semiconductor device 41 as will be explained below with reference to the plan view of FIG. 6. The contact groove $43_{1a}$ is filled with a conductive wall $43_{1b}$ of W, and the like.

In the construction of FIG. 7, it should be noted that the interlayer insulation film $43_1$ is covered by an SiN film $43_2$ functioning as an etching stopper, and another interlayer insulation film $43_3$ is deposited on the etching stopper film $43_2$. The interlayer insulation film $43_3$ may be formed of any of an inorganic insulation film such as $SiO_2$, PSG or BPSG, or an organic insulation film such as fluorocarbon, hydrocarbon, polyimide or organic SOG, similar to the interlayer insulation film $43_1$.

Further, the interlayer insulation film $43_3$ is formed with a groove $43_{3a}$ so as to expose the top surface of the interlayer insulation film $43_1$ penetrating through the etching stopper layer $43_2$ underneath, wherein the groove $43_{3a}$ exposes the foregoing contact groove $43_{1a}$. The groove $43_{3a}$ is then filled with a conductive pattern $43_{3b}$ of W. The conductive pattern $43_{3b}$ thus formed makes a continuous contact with the conductive wall $43_{1b}$.

The conductive pattern $43_{3b}$ has a flush surface with the interlayer insulation film $43_3$, and the interlayer insulation film $43_1$, the etching stopper film $43_2$ and the interlayer insulation film $43_3$ form together an interlayer insulation structure 43.

On the interlayer insulation structure 43, there is provided an interlayer insulation film $44_1$ of any of an inorganic insulation film such as $SiO_2$, PSG or BPSG, or an organic insulation film such as fluorocarbon, hydrocarbon, polyimide or organic SOG similar to the interlayer insulation film $43_1$, such that the interlayer insulation film $44_1$ covers the conducto9r pattern $43_{3b}$. The interlayer insulation film $44_1$ is formed with a contact groove $44_{1a}$ exposing the conductive pattern $43_{3b}$, wherein the contact groove $44_{1a}$ has a zigzag pattern and extends continuously along the outer periphery of the semiconductor device 41 constituting an integrated circuit as will be explained below with reference to FIG. 6. The contact groove $44_{1a}$ is filled with a conductive wall $44_{1b}$ of Cu, W, and the like.

The interlayer insulation film $44_1$ is covered by an SiN film $44_2$ functioning as an etching stopper, and another interlayer insulation film $44_3$ is deposited on the etching stopper film $44_2$. The interlayer insulation film $44_3$ may be formed of any of an inorganic insulation film such as $SiO_2$, PSG or BPSG, or an organic insulation film such as fluorocarbon, hydrocarbon, polyimide or organic SOG, similar to the interlayer insulation film $44_1$.

Further, the interlayer insulation film $44_3$ is formed with a groove $44_{3a}$ so as to expose the top surface of the interlayer insulation film $44_1$ penetrating through the etching stopper layer $44_2$ underneath, wherein the groove $44_{3a}$ exposes the foregoing contact groove $44_{1a}$. The groove $44_{3a}$ is then filled with a conductive pattern $44_{3b}$ of W. The conductive pattern $44_{3b}$ thus formed makes a continuous contact with the conductive wall $44_{1b}$.

The conductive pattern $44_{3b}$ has a flush surface with the interlayer insulation film $44_3$, and the interlayer insulation film $44_1$, the etching stopper film $44_2$ and the interlayer insulation film $44_3$ form together an interlayer insulation structure 44.

On the interlayer insulation structure 44, there is provided an interlayer insulation film $45_1$ of any of an inorganic insulation film such as $SiO_2$, PSG or BPSG, or an organic insulation film such as fluorocarbon, hydrocarbon, polyimide or organic SOG similar to the interlayer insulation film $44_1$, such that the interlayer insulation film $45_1$ covers the conducto9r pattern $44_{3b}$. The interlayer insulation film $45_1$ is formed with a contact groove $45_{1a}$ exposing the conductive pattern $44_{3b}$, wherein the contact groove $45_{1a}$ has a zigzag pattern and extends continuously along the outer periphery of the semiconductor device 41 as will be explained below with reference to FIG. 6. The contact groove $45_{1a}$ is filled with a conductive wall $45_{1b}$ of Cu, W, and the like.

The interlayer insulation film $45_1$ is covered by an SiN film $45_2$ functioning as an etching stopper, and another interlayer insulation film $45_3$ is deposited on the etching stopper film $45_2$. The interlayer insulation film $45_3$ may be formed of any of an inorganic insulation film such as $SiO_2$, PSG or BPSG, or an organic insulation film such as fluorocarbon, hydrocarbon, polyimide or organic SOG, similar to the interlayer insulation film $45_1$.

Further, the interlayer insulation film $45_3$ is formed with a groove $45_{3a}$ so as to expose the top surface of the interlayer insulation film $45_1$ penetrating through the etching stopper layer $45_2$ underneath, wherein the groove $45_{3a}$ exposes the foregoing contact groove $45_{1a}$. The groove $45_{3a}$ is then filled with a conductive pattern $45_{3b}$ of W. The conductive pattern $45_{3b}$ thus formed makes a continuous contact with the conductive wall $45_{1b}$.

The conductive pattern $45_{3b}$ has a flush surface with the interlayer insulation film $45_3$, and the interlayer insulation film $45_1$, the etching stopper film $45_2$ and the interlayer insulation film $45_3$ form together an interlayer insulation structure 45. Further, a protective film 46 of SiN is formed on the interlayer insulation film $45_3$.

In the layered structure in which the foregoing interlayer insulation structures 43–45 are stacked, water or corrosive gas penetrating along the layer boundary is effectively blocked by the conductive walls $43_{1b}$, $44_{1b}$ and $45_{1b}$ and/or by the conductive patterns $43_{3b}$, $44_{3b}$ and $45_{3b}$. Thereby, the conductive walls $43_{1b}$, $44_{1b}$ and $45_{1b}$ and the conductive patterns $43_{3b}$, $44_{3b}$ and $45_{3b}$ form together a guard ring 40A of the semiconductor integrated circuit 40.

FIGS. 8A–8D show the fabrication process of the semiconductor device 40 of FIG. 7.

Figure 8A:
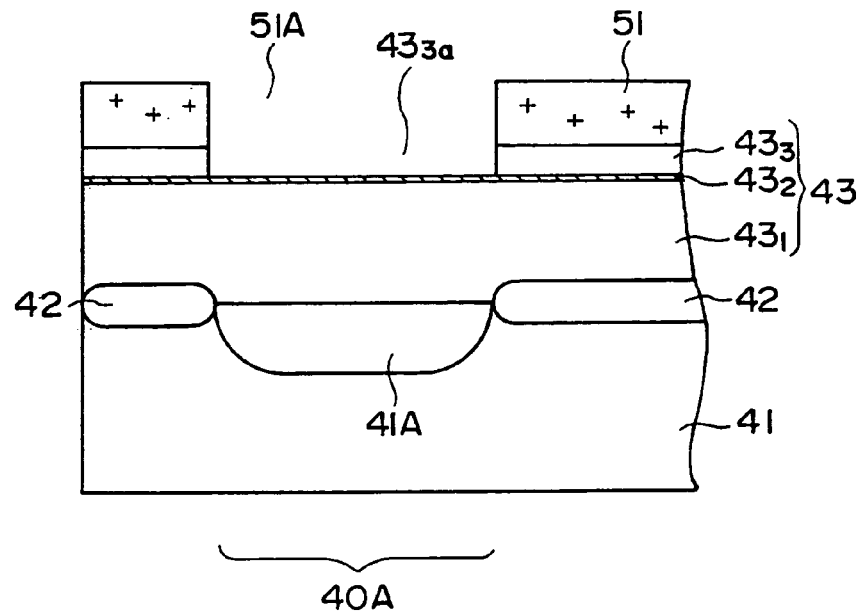
FIGS. 8A–8D are diagrams showing the fabrication step of the semiconductor device of FIG. 6.

Referring to FIG. 8A, the interlayer insulation film $43_1$, SiN etching stopper layer $43_2$ and the interlayer insulation film $43_3$ are deposited consecutively on the Si substrate 41 on which the diffusion region 41A and the field oxide film 42 are formed, and a resist pattern 51 having a resist opening 51A is formed on the interlayer insulation film $43_3$. Further, a dry etching process is conducted while using the resist pattern 51 as a mask, until the etching stopper $43_2$ is exposed. As a result of the dry etching process, a groove $43_{3a}$ is formed in the interlayer insulation film $43_3$.

Figure 8B:
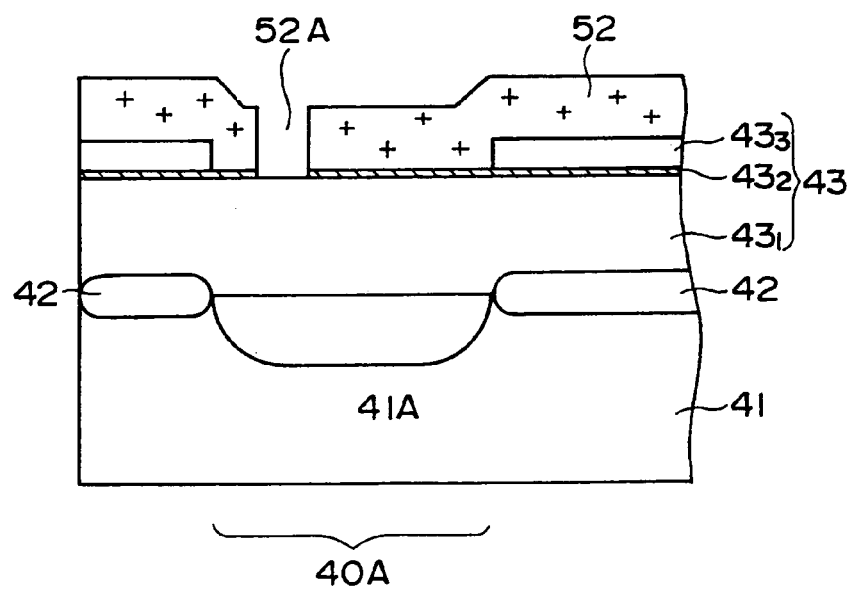

Next, in the step of FIG. 8B, the resist pattern 51 is removed and another resist pattern 52 is formed on the structure thus formed such that the resist pattern 52 has a resist opening 52 inside the groove $43_{3a}$. Further, by applying a dry etching process to the SiN film $43_2$ and the interlayer insulation film $43_1$ while using the resist pattern 51 as a mask, a structure represented in FIG. 8C is obtained.

Figure 8C:
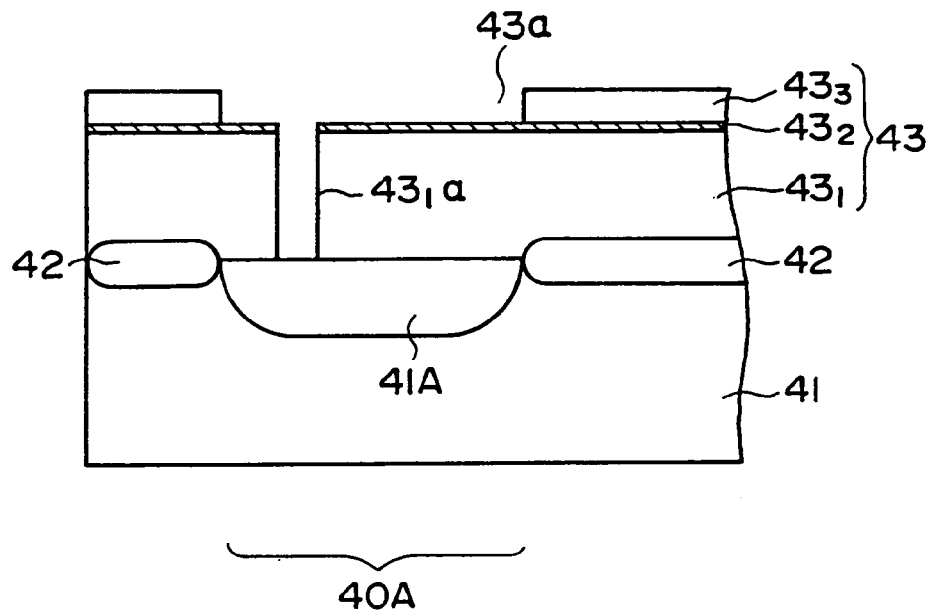
Figure 8D:
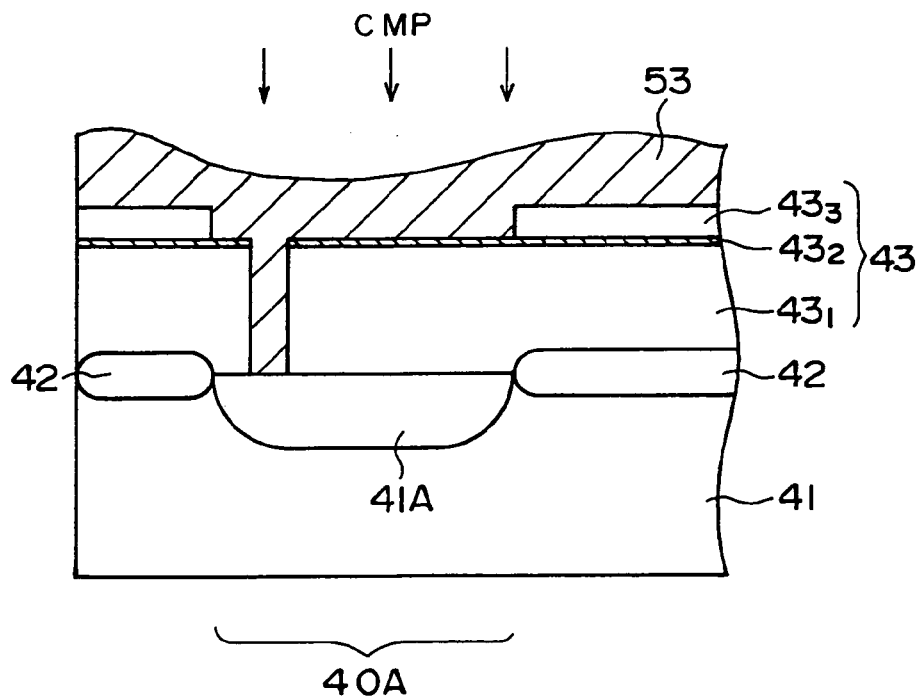

Next, in the step of FIG. 8D, a Cu layer 53 is deposited on the structure of FIG. 8C by a sputtering process of electrolytic plating process. Further, by removing the Cu layer 53 for the part locating above the interlayer insulation film $43_3$ by a CMP process. Further, by repeating the similar processes, the structure of FIG. 7 is obtained.

Referring to the plan view of FIG. 6 again, the uppermost conductive pattern $45_{3b}$ extends along an edge surface 41E of the semiconductor substrate 41 with a typical width L of 10 μm, wherein it will be noted that the uppermost conductive wall $45_{1b}$ extends, within a band-like region having a width of $L_w$ of typically 8 μm, with a zigzag pattern. The conductive wall $45_{1b}$ itself has a width Wc of typically 0.5 μm.

As can be seen in the cross-sectional view of FIG. 7, the lowermost conductive patterns $43_{3b}$ and $44_{3b}$ extend parallel with the uppermost conductive pattern $45_{3b}$, while the intermediate conductive wall $44_{1b}$ has a zigzag pattern of the anti-phase relationship with respect to the uppermost conductive wall $45_{1b}$. On the other hand, the lowermost conductive wall $43_{1b}$ extends in an in-phase relationship with respect to the uppermost conductive wall $45_{1b}$.

More specifically, each of the conductive walls $43_{1b}$, $44_{1b}$ and $45_{1b}$ are bent repeatedly and alternately with an angle θ of ±120° in each unit lengthy Lc of typically 6.4 μm. Thereby, the conductive walls $43_{1b}$, $44_{1b}$ and $45_{1b}$ have a width $W_{CL}$ of about 0.58 μm when measured in the direction perpendicular to the edge surface 41E, and a margin $L_a$ of about 1 μm is secured between the side edge of the conductive wall and the edge surface 41E.

Figure 1A:
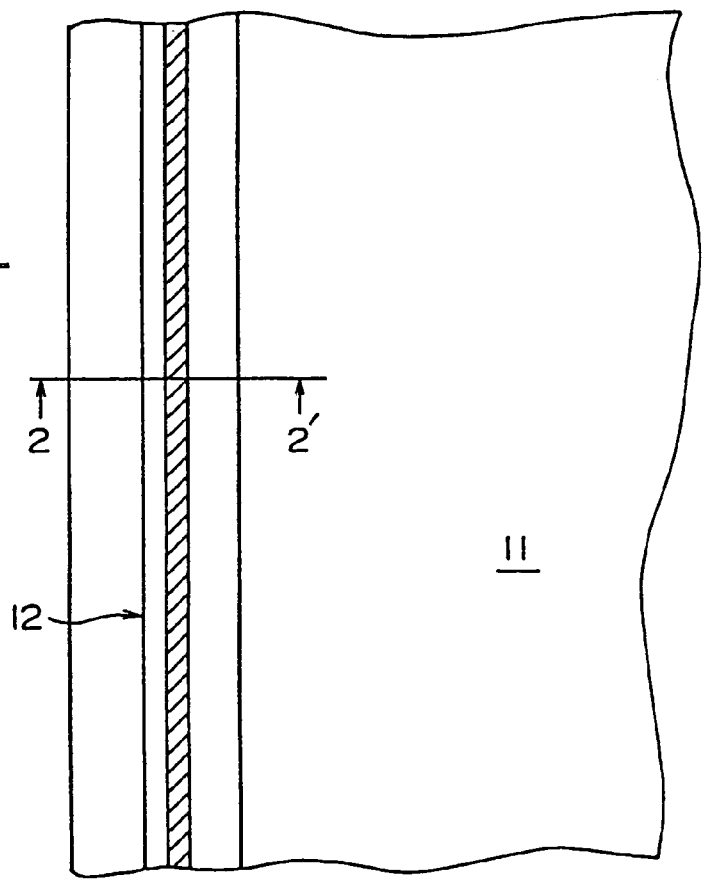
FIGS. 1A and 1B are diagrams showing a guard ring structure of a related art.
Figure 1B:
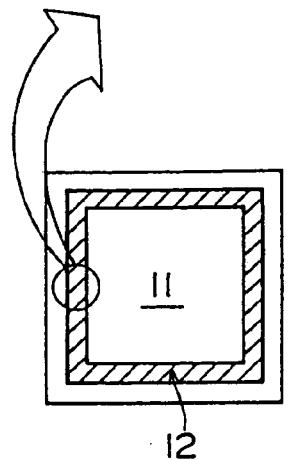
Figure 2:
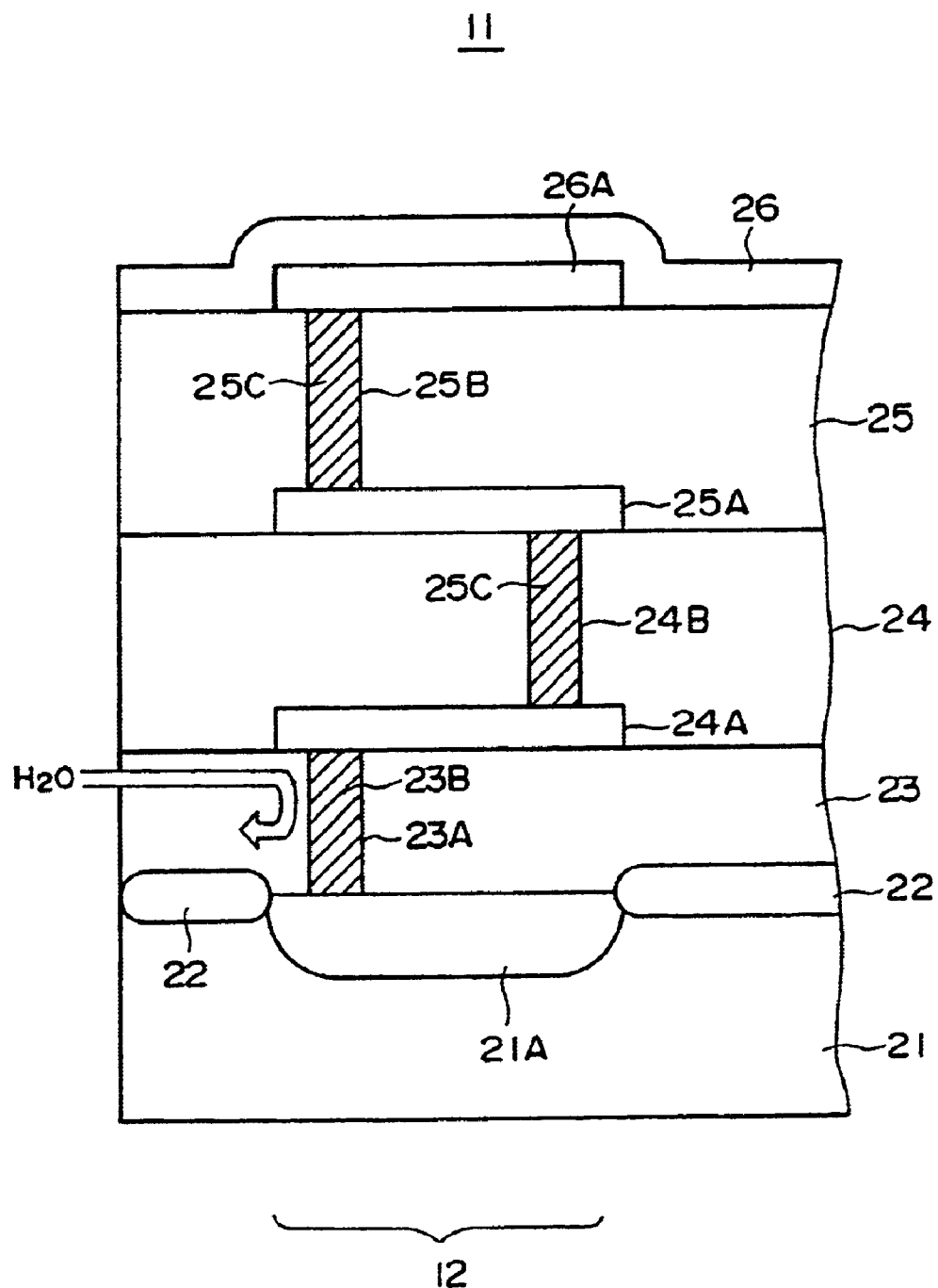
FIG. 2 is a diagram showing the guard ring structure of the related art in a cross-sectional view.
Figure 3:
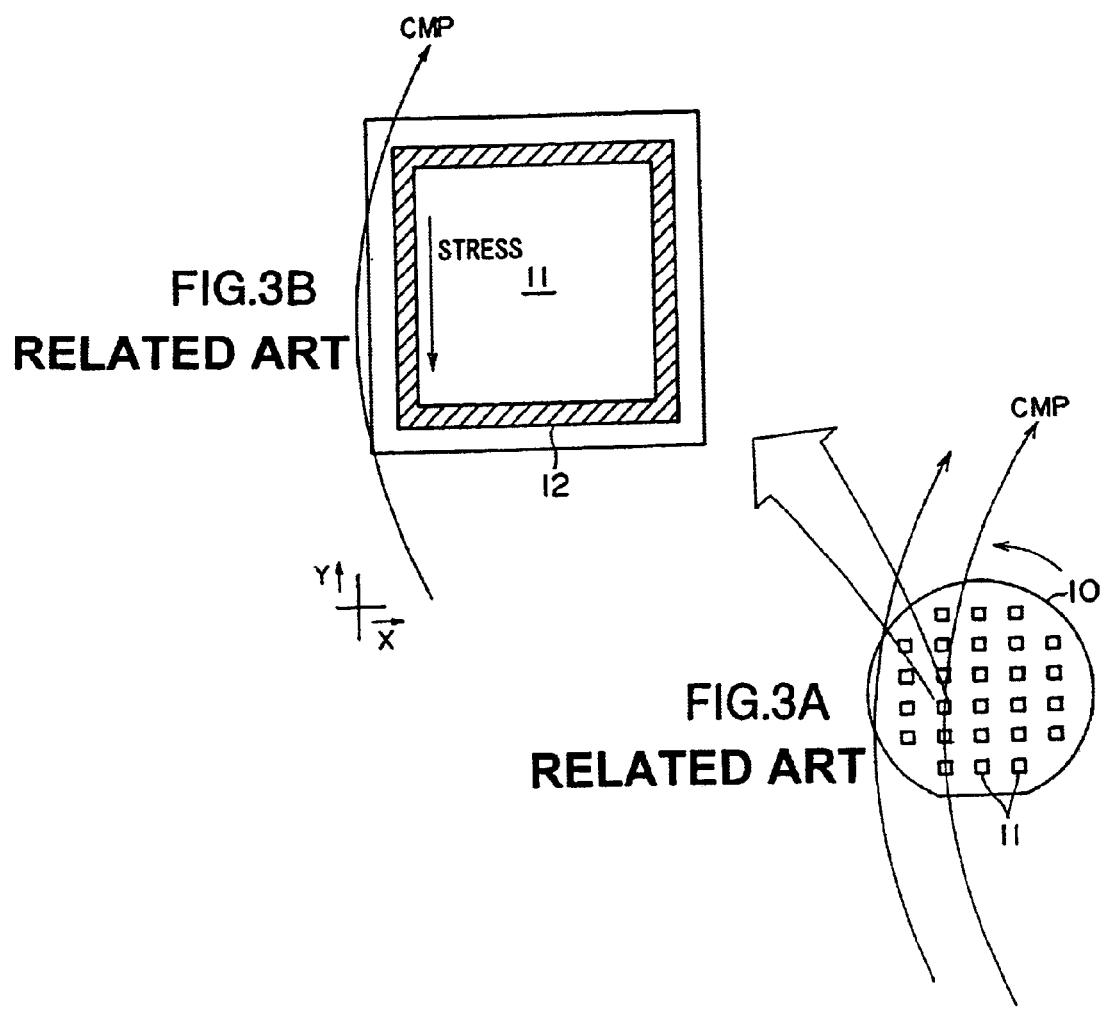
FIGS. 3A and 3B are diagrams showing a CMP process according to a related art.
Figure 4:
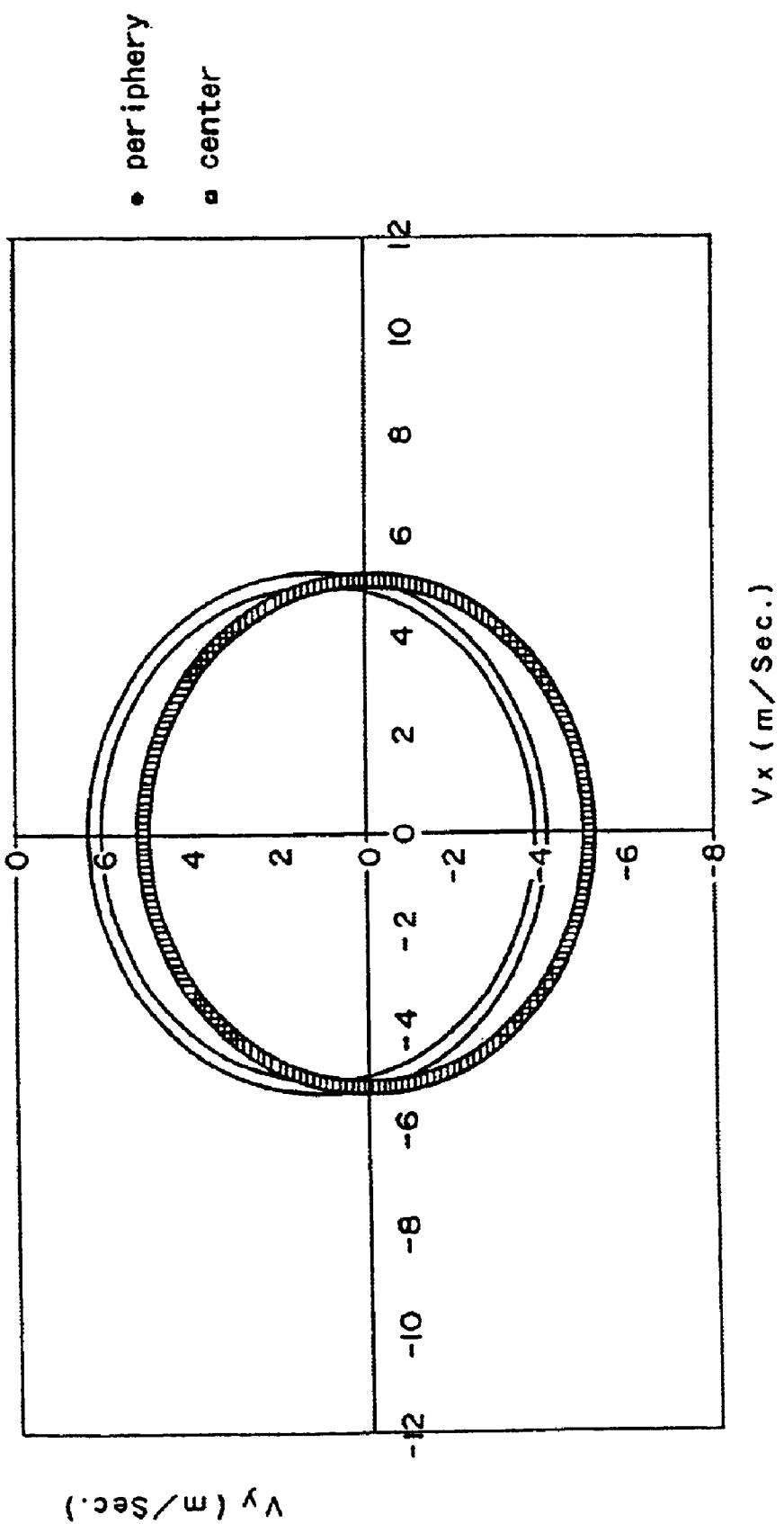
FIG. 4 is a diagram showing the relative distribution of slurry particles during a CMP process of a wafer.

When a CMP process is applied to the guard ring 40A having such a structure in the step of FIG. 8D, a stress acting oppositely to the polishing direction is applied to the guard ring 40A, and each of the conductive walls $43_{1b}$, $44_{1b}$ and $45_{1b}$ experience a stress component acting in the elongating direction thereof. On the other hand, in view of the fact that the length of elongation of the conductive walls is limited within the length $L_c$ (more exactly the length of $(L_w^2 + L_c^2)^{1/2}$ for each of the conductive walls $43_{1b}$, $44_{1b}$ and $45_{1b}$, the situation of the stress acting to the guard ring extending over a long distance as in the case of FIGS. 1A and 1B is effectively avoided. It should be noted that each of the conductive walls $43_{1b}$, $44_{1b}$ and $45_{1b}$ constituting the guard ring 40A has the longitudinal ends supported by the interlayer insulation structure 43, 44 or 45, and the exfoliation is effectively avoided even in such a case a defective part is included in the conductive wall.

[Second Embodiment]

Figure 9:
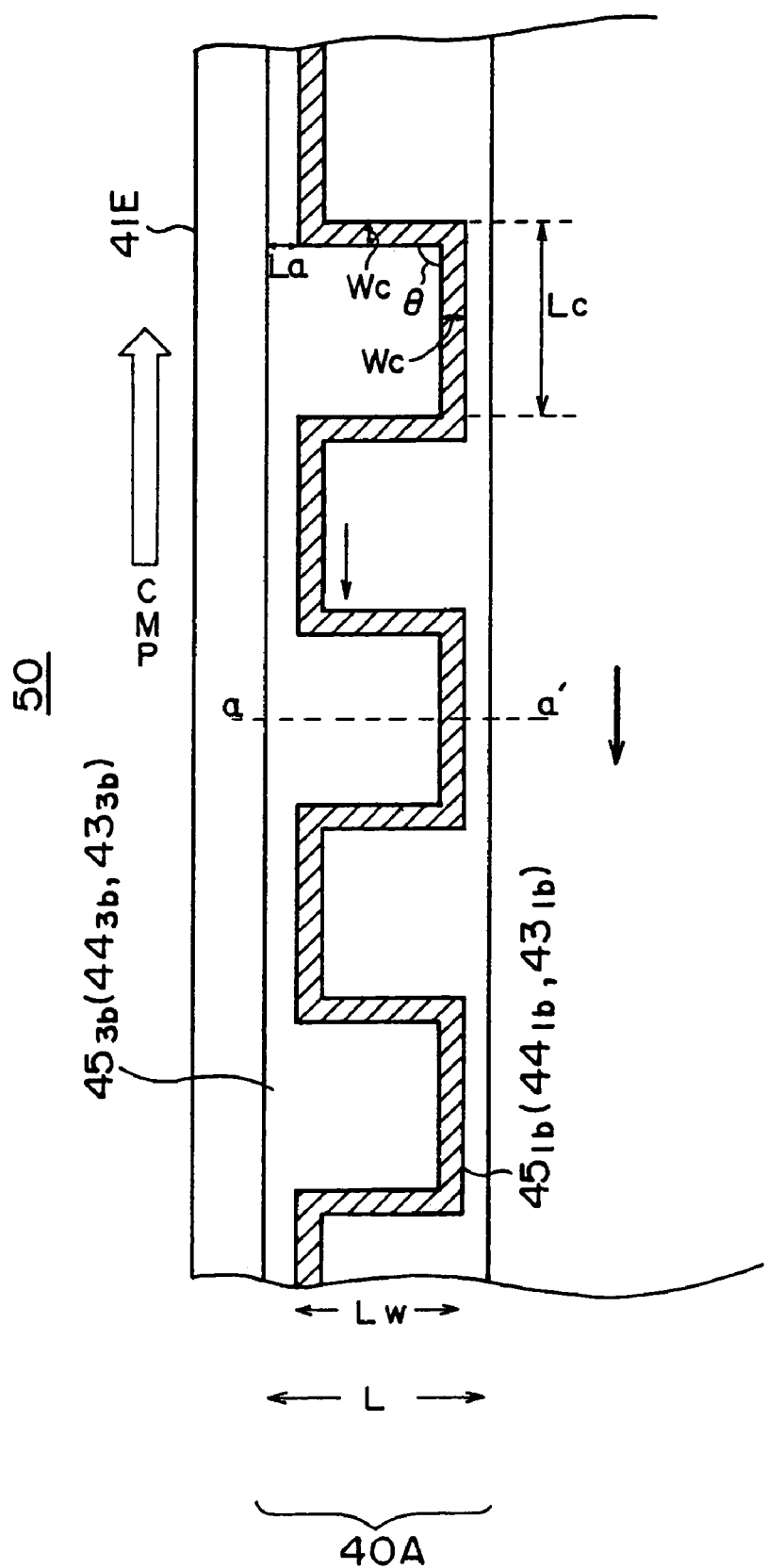
FIG. 9 is a diagram showing a guard ring structure according to a second embodiment of the present invention in a plan view.

FIG. 9 shows the construction of a semiconductor device 50 according to a second embodiment of the present invention in a plan view. As the semiconductor device 50 of the present embodiment is a modification of the semiconductor device 40 described previously, those parts corresponding to the parts described previously are designated by the same reference numerals and the description thereof will be omitted.

Referring to FIG. 9, the uppermost conductive pattern $45_{3b}$ extends along the edge surface 41E of the semiconductor substrate 41 with a typical width L of 10 μm, wherein it will be noted that the uppermost conductive wall $45_{1b}$ extends, within a band-like region having a width of $L_w$ of typically 8 μm, with a rectangular wave pattern. The conductive wall $45_{1b}$ itself has a width Wc of typically 0.5 μm.

In the present embodiment, too, the lowermost conductive patterns $43_{3b}$ and $44_{3b}$ extend parallel with the uppermost conductive pattern $45_{3b}$, while the intermediate conductive wall $44_{1b}$ has a zigzag pattern of the anti-phase relationship with respect to the uppermost conductive wall $45_{1b}$. On the other hand, the lowermost conductive wall $43_{1b}$ extends in a in-phase relationship with respect to the uppermost conductive wall $45_{1b}$.

More specifically, each of the conductive walls $43_{1b}$, $44_{1b}$ and $45_{1b}$ are bent repeatedly and alternately with an angle θ of ±90° in each unit lengthy Lc of typically 6.4 μm. Thereby, the conductive walls $43_{1b}$, $44_{1b}$ and $45_{1b}$ have a width $W_{CL}$ of about 0.58 μm when measured in the direction perpendicular to the edge surface 41E, and a margin $L_a$ of about 1 μm is secured between the side edge of the conductive wall and the edge surface 41E.

Figure 5:
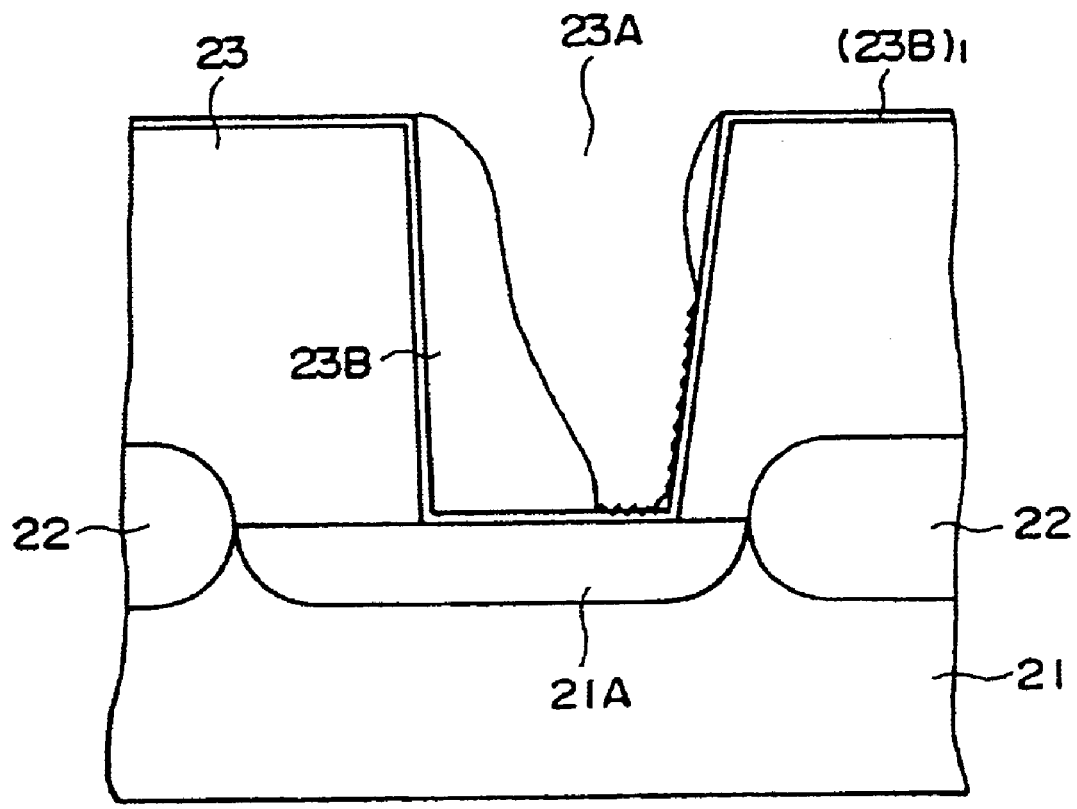
FIG. 5 is a diagram showing an example of a defective guard ring structure.

When a CMP process is applied to the guard ring 40A having such a structure in the step of FIG. 8D, a stress acting oppositely to the polishing direction is applied to the guard ring 40A, and each of the conductive walls $43_{1b}$, $44_{1b}$ and $45_{1b}$ experience a stress component acting in the elongating direction thereof. On the other hand, in view of the fact that the length of elongation of the conductive walls is limited for each of the conductive walls $43_{1b}$, $44_{1b}$ and $45_{1b}$, the situation of the stress acting to the guard ring extending over a long distance as in the case of FIGS. 1A and 1B is effectively avoided. It should be noted that each of the conductive walls $43_{1b}$, $44_{1b}$ and $45_{1b}$ constituting the guard ring 40A has the longitudinal ends supported by the interlayer insulation structure 43, 44 or 45, and the exfoliation as explained with reference to FIG. 5 is effectively avoided even in such a case a defective part is included in the conductive wall.

[Third Embodiment]

Figure 10:
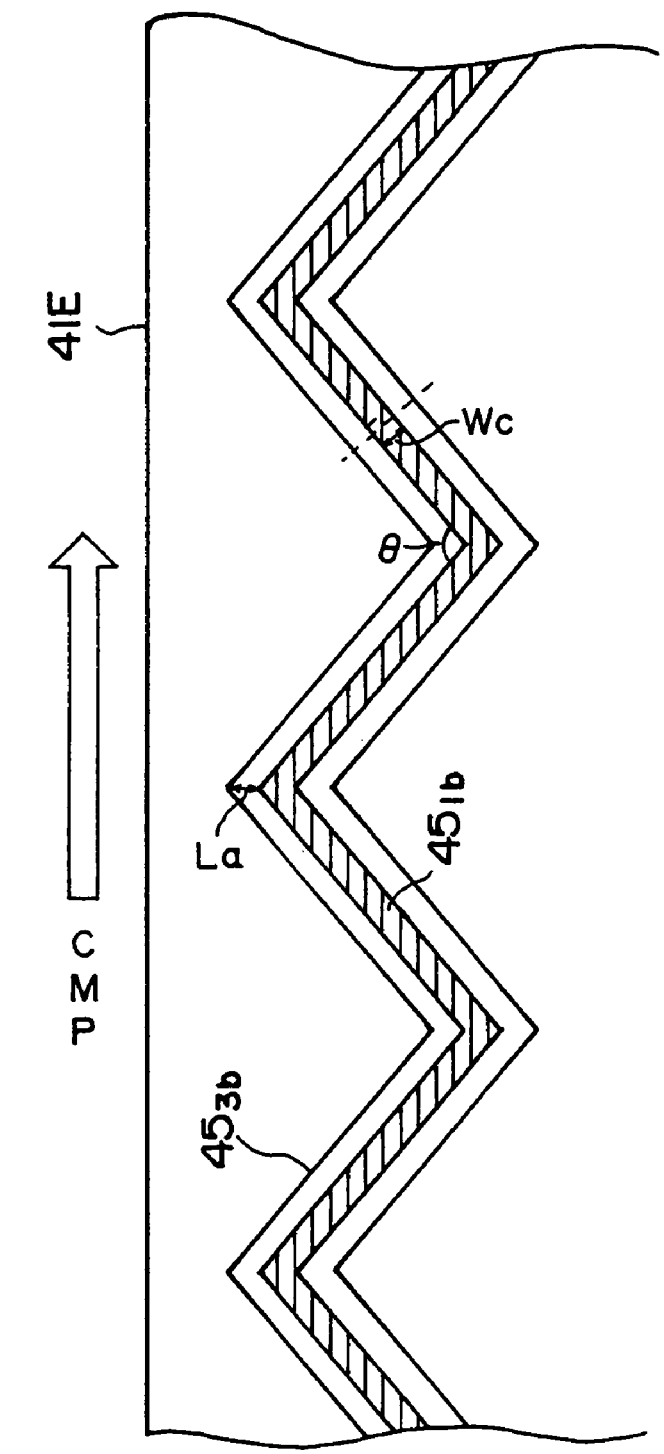
FIG. 10 is a diagram showing a guard ring structure according to a third embodiment of the present invention in a plan view.

FIG. 10 shows the construction of a semiconductor device 60 according to a third embodiment of the present invention in a plan view. As the semiconductor device 60 of the present embodiment is a modification of the semiconductor device 40 described previously, those parts corresponding to the parts described previously are designated by the same reference numerals and the description thereof will be omitted.

Referring to FIG. 10, the uppermost conductive wall $45_{1b}$ extends in the form of a zigzag pattern, in a band region typically having a width of 8 μm, with a width $W_c$ of 0.5 μm, and the uppermost conductive pattern $45_{3b}$ extends along the conductive wall $45_{1b}$ with a typical width L of 10 μm in the form of a corresponding zigzag pattern.

In the present embodiment, too, the intermediate conductive wall $44_{1b}$ extends in a zigzag pattern with an anti-phase relationship with respect to the uppermost conductive wall $45_{1b}$. On the other hand, the lowermost conductive wall $43_{1b}$ extends zigzag in an in-phase relationship with respect to the uppermost conductive wall $45_{1b}$. Associated with this, the conductive pattern $44_{3b}$ of the intermediate layer extend zigzag along the intermediate conductive wall $44_{1b}$, and the conductive pattern $43_{3b}$ extends also zigzag along the lowermost conductive wall $43_{1b}$.

More specifically, each of the conductive walls $43_{1b}$, $44_{1b}$ and $45_{1b}$ are bent repeatedly and alternately with an angle θ of ±120° in each unit lengthy Lc of typically 6.4 μm. Thereby, a margin $L_a$ of about 1 μm is secured between the side edge of the conductive wall and the edge surface 41E.

When a CMP process is applied to the guard ring 40A having such a structure in the step of FIG. 8D, a stress acting oppositely to the polishing direction is applied to the guard ring 40A, and each of the conductive walls $43_{1b}$, $44_{1b}$ and $45_{1b}$ experience a stress component acting in the elongating direction thereof. On the other hand, in view of the fact that the length of elongation of the conductive walls is limited for each of the conductive walls $43_{1b}$, $44_{1b}$ and $45_{1b}$, the situation of the stress acting upon the guard ring extending over a long distance as in the case of FIGS. 1A and 1B is effectively avoided. It should be noted that each of the conductive walls $43_{1b}$, $44_{1b}$ and $45_{1b}$ constituting the guard ring 40A has the longitudinal ends supported by the interlayer insulation structure 43, 44 or 45, and the exfoliation as explained with reference to FIG. 5 is effectively avoided even in such a case a defective part is included in the conductive wall.

[Fourth Embodiment]

FIG. 11 shows the construction of a semiconductor device 70 according to a fourth embodiment of the present invention in a plan view. As the semiconductor device 70 of the present embodiment is a modification of the semiconductor device 50 described previously, those parts corresponding to the parts described previously are designated by the same reference numerals and the description thereof will be omitted.

Referring to FIG. 11, the uppermost conductive wall $45_{1b}$ extends in the form of a rectangular waveform pattern, in a band region typically having a width of 8 μm, with a width $W_c$ of 0.5 μm, and the uppermost conductive pattern $45_{3b}$ extends along the conductive wall $45_{1b}$ with a typical width L of 10 μm in the form of a corresponding rectangular waveform pattern.

In the present embodiment, too, the intermediate conductive wall $44_{1b}$ extends in a rectangular waveform pattern with an anti-phase relationship with respect to the uppermost conductive wall $45_{1b}$. On the other hand, the lowermost conductive wall $43_{1b}$ extends in a rectangular waveform pattern of the in-phase relationship with respect to the uppermost conductive wall $45_{1b}$. Associated with this, the conductive pattern $44_{3b}$ of the intermediate layer extend in the rectangular waveform pattern along the intermediate conductive wall $44_{1b}$, and the conductive pattern $43_{3b}$ extends also in the form of rectangular waveform pattern zigzag along the lowermost conductive wall $43_{1b}$.

More specifically, each of the conductive walls $43_{1b}$, $44_{1b}$ and $45_{1b}$ are bent repeatedly and alternately with an angle θ of ±90° in each unit lengthy Lc of typically 6.4 μm. Thereby, a margin $L_a$ of about 1 μm is secured between the side edge of the conductive wall and the edge surface 41E.

When a CMP process is applied to the guard ring 40A having such a structure in the step of FIG. 8D, a stress acting oppositely to the polishing direction is applied to the guard ring 40A, and each of the conductive walls $43_{1b}$, $44_{1b}$ and $45_{1b}$ experience a stress component acting in the elongating direction thereof. On the other hand, in view of the fact that the length of elongation of the conductive walls is limited for each of the conductive walls $43_{1b}$, $44_{1b}$ and $45_{1b}$, the situation of the stress acting upon the guard ring extending over a long distance as in the case of FIGS. 1A and 1B is effectively avoided. It should be noted that each of the conductive walls $43_{1b}$, $44_{1b}$ and $45_{1b}$ constituting the guard ring 40A has the longitudinal ends supported by the interlayer insulation structure 43, 44 or 45, and the exfoliation as explained with reference to FIG. 5 is effectively avoided even in such a case a defective part is included in the conductive wall.

In the present invention, it should be noted that the conductive patterns and conductive walls constituting the guard ring is not limited to Cu but various other metals or conductors such as W, Au, Al, polysilicon, and the like, may be used also. Further, it is not necessary for the guard ring to surround the substrate continuously and completely, but the guard ring may be formed intermittently.

Further, the present invention is not limited to the embodiments described heretofore, but various variations and modifications may be made without departing from the scope of the invention.

What is claimed is:

1. A semiconductor device, comprising:

a substrate; and a multilayer interconnection structure formed on said substrate, said multilayer interconnection structure including: at least first and second interlayer insulation films provided on said substrate; and a guard ring pattern embedded in each of said first and second interlayer insulation films for blocking penetration of moisture, said guard ring pattern extending along a periphery of said substrate, said multilayer interconnection structure being planarized by using a CMP process, wherein said guard ring pattern changes a direction thereof repeatedly and alternately in a plane parallel to said substrate, said guard ring pattern including: a groove formed in each of said first and second interlayer insulation films, said groove changing a direction thereof repeatedly and alternatively in a plane parallel to said substrate, a conductive wall filling said groove in each of said first and second interlayer insulation films and extending from a bottom principal surface thereof to a top principal surface thereof; and a conductive pattern making a contact with a top part of said conductive wall and having a principal surface coincident to said top principal surface of said interlayer insulation film, said conductive wall changing a direction thereof repeatedly and alternately in one of a triangular wave pattern and a rectangular wave pattern in said plane in correspondence to said guard ring pattern, said conductive wall in said first interlayer insulation film being offset with respect to said conductive wall in said second interlayer insulation film in a direction parallel to a principal surface of said substrate when viewed in a direction perpendicular to said principal surface of said substrate;

and wherein said interlayer insulation films comprise a first insulation film that supports said conductive wall laterally and a second insulation film that supports said conductive pattern laterally, said conductive wall and conductive pattern comprising Cu, said conductive pattern and said second insulation film having coplanar top principal surfaces, a bottom edge of said conductive wall making an intimate contact with said top principal surface of said conductive pattern, and said conductive pattern and said second insulation film located at a top part of said multilayer interconnection structure being covered continuously with an insulation film.

2. A semiconductor device as claimed in claim 1, wherein said guard ring pattern extends continuously along said periphery of said substrate.

3. A semiconductor device as claimed in claim 1, wherein said conductive pattern extends in the form of a straight line along a peripheral edge of said substrate.

4. A semiconductor device as claimed in claim 1, wherein said conductive pattern changes a direction thereof repeatedly and alternately in said plane in correspondence to said conductive wall.

5. A semiconductor device as claimed in claim 1, further comprising an etching stopper layer interposed between said first insulation film and said second insulation film.

* * * * *